Feb. 2, 1971 J. E. KAUFFMAN 3,559,285

METHOD OF FORMING LEADS FOR ATTACHMENT TO SEMI-CONDUCTOR DEVICES

Filed Jan. 8, 1968 3 Sheets-Sheet 1

INVENTOR
JOHN EDWARD KAUFFMAN
BY
Seidel & Gonda
ATTORNEYS.

INVENTOR
JOHN EDWARD KAUFFMAN
BY
Seidel & Gonda
ATTORNEYS.

Feb. 2, 1971 J. E. KAUFFMAN 3,559,285

METHOD OF FORMING LEADS FOR ATTACHMENT TO SEMI-CONDUCTOR DEVICES

Filed Jan. 8, 1968 3 Sheets-Sheet 3

INVENTOR
JOHN EDWARD KAUFFMAN
BY
Seidel & Gonda
ATTORNEYS.

3,559,285

METHOD OF FORMING LEADS FOR ATTACHMENT TO SEMI-CONDUCTOR DEVICES

John Edward Kauffman, Beth Ayres, Pa., assignor to The Jade Corporation, Beth Ayres, Pa.

Continuation-in-part of application Ser. No. 653,890, July 17, 1967. This application Jan. 8, 1968, Ser. No. 789,857
Int. Cl. H01r *9/00*
U.S. Cl. 29—630 7 Claims

ABSTRACT OF THE DISCLOSURE

A method of attaching leads to a semi-conductor device includes the steps of inlaying a contacting metal compatible with a semi-conductor element along a metal strip, upsetting the metal strip at spaced portions therealong so as to provide a depression on one side and an upstanding portion on the opposite side of the metal strip, removing the upstanding portion so that the inlay and strip is substantially reduced in thickness at said spaced portions, and then stamping the strip at said spaced portions to define the integral cantilever leads having the contacting metal on their exposed ends.

This application is a continuation-in-part of patent application Ser. No. 653,890 filed July 17, 1967 now U.S. Pat. No. 3,436,810.

The present invention is an improvement upon the above-identified method of packaging integrated circuits wherein there is disclosed a method of stamping a lead frame in a manner so that the semi-conductor chip or the like can be welded directly to the terminal ends of the leads. The present invention is concerned with an improvement in the method of making the lead frame.

In the previous invention the terminal ends of the leads were manufactured by forming holes in a repetitive pattern in a strip of metal at spaced positions therealong. Thereafter, the thickness of the metal strip was reduced in the area surrounding the hole and then the reduced thickness portion was coated with a metal compatible with the integrated circuit component. Finally, The strip is stamped at spaced points so as to form integral cantilever leads having terminal ends coated with the compatible metal. The result was a lead frame on which the semi-conductor element could be positioned and thereafter fixed by known welding methods such as ultrasonic welding, thermocompression bonding, or soldering.

The present invention is an improvement upon the previous invention in that it is even more adaptable to high speed production line processing. Moreover, the present method is more capable of conforming to industry standards concerning processing of metal using particular types of machines. For example, continuous cladding or inlaying avoids some of the difficulties encountered in any cycling type of machinery. Another example of avoiding cycling machinery is where a continuous strip of metal, having projections is fed past a stationary cutter. Still another example of conforming to industry standards and yet obtain high speed production is in relation to material thickness and punch strength. It is generally accepted that a punch must be one and one-half times the thickness of the metal to be punched in order to assure punch life. The present invention eliminates the need for certain punching steps and hence is more adaptable to the standard of the industry.

For the purpose of illustrating the invention, there are shown in the drawings forms which are presently preferred; it being understood, however, that this invention is not limited to the precise arrangements and instrumentalities shown.

Figure 1:
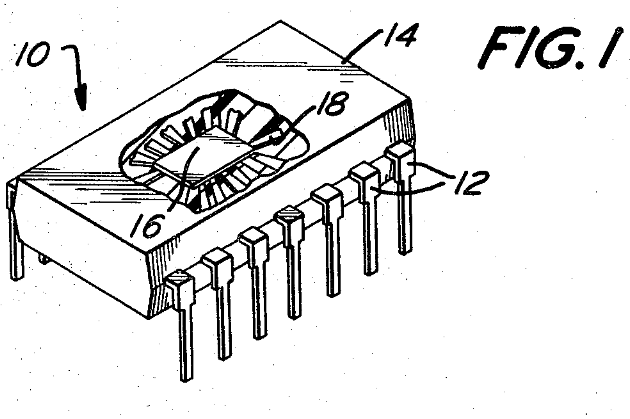
FIG. 1 is a perspective view of a dual-in-line integrated circuit package which is partially broken away for purposes of illustration.

Referring now to the drawings in detail, wherein like numerals indicate like elements, there is shown in FIG. 1 a packaged semi-conductor device such as a dual-in-line integrated circuit designated generally as 10. The package 10 has seven leads extending from each side of a molded casing 14. There are seven leads on each side of the disclosed embodiment, but the method is equally applicable to other packages. The leads 12 are bonded as for example by welding to an integrated circuit chip or some other semi-conductor device 16 and may be used to connect the semi-conductor 16 to other circuit elements. As shown in the broken-away portion of the figure, the inner terminal ends 18 of the leads 12 are bonded, such as by welding, directly to the semi-conductor chip 16. The package 14 is preferably a plastic, glass or ceramic material which seals the semi-conductor device 16 and the terminal ends 18 against attack by an outside agent.

The present invention is concerned with the process of manufacturing the above-described integrated circuit package 10. The aforesaid patent application Ser. No. 653,890 filed July 17, 1967 and now U.S. Pat. No. 3,436,-810 describes a new and improved process for packaging the integrated circuit. The present invention is an improvement on that process, and in particular, it is an improvement in certain steps of that process. Reference should be had to the following detailed description of the process for a better understanding of the nature of this invention.

Figure 2:
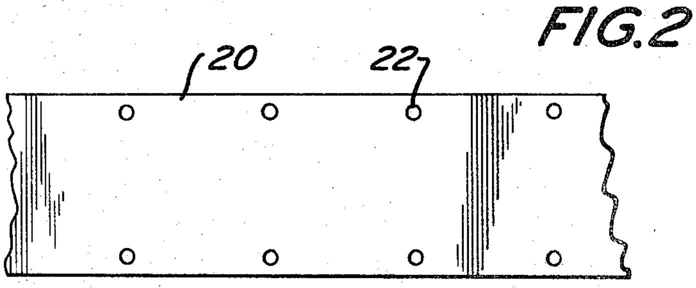
FIG. 2 is a plan view of a portion of a strip of metal.
Figure 3:
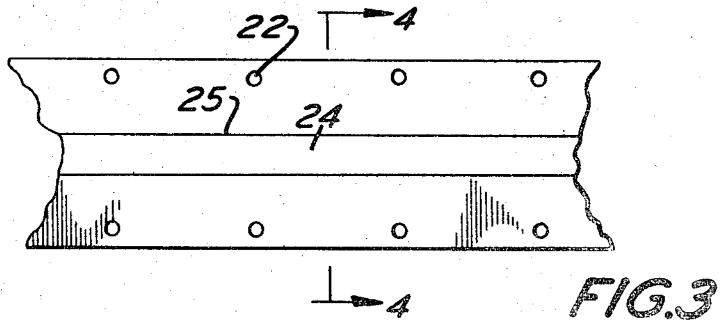
FIG. 3 is a plan view of the strip of metal shown in FIG. 2 after subsequent processing.
Figure 4:
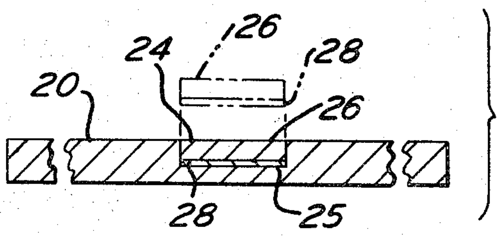
FIG. 4 is a cross sectional view of the strip after subsequent processing.

In FIG. 2 there is illustrated an elongated strip of metal 20 from which a large number of sets of leads 12 may be manufactured for use with individual semi-conductor chips 16. For purposes of this description the strips 20 may be regarded as being endless. The strip 20 is made of any one of the metals which is commonly used for the manufacturing the leads of semi-conductor devices as for example Kovar, nickel or mild steel. The strip 20 preferably has a thickness of approximately .01 inch and a width of approximately one and one-quarter inches, although these dimensions may be varied as required. The strip 20 has previously been provided with pilot holes 22 at equally spaced points therealong. The pilot holes 22 serve to orientate the strip in much the same manner as perforations in movie film. Additional orientation and machine handling modifications may be made to the strip as for example edge cuts. These modifications (not shown) may be referred to as information or coding devices.

The first step in the present process is to provide an endless inlay or surface strip 24 of metal along the longitudinal axis of the strip 20. As is well known in the art, Kovar, nickel or mild steel cannot be directly welded to silicon or other semi-conductor devices because of metallurgical incompatibilities resulting in poor ohmic and mechanical bonds along with debilitating chemical activities which also serve to further degradate an already weak contact structure. Thus, the junction between the semi-conductor device 16 and the terminal leads 18 must be formed by a metal which is compatible with other metals deposited on the semi-conductor surface. One such metal is aluminum but there are others such as gold. The present invention will be described in connection with aluminum but those skilled in the art will readily recognize that gold or other equivalents may be substituted.

In the preferred embodiment, the process step of providing a compatible metal (i.e., a contacting metal) includes the steps of first forming the recess 25 along the center line of the strip 20. The recess 25 is shown in each instance to be equidistant from the orientation holes 22 and may be formed by any one of several manufacturing processes such as skiving, milling, rolling, or the like. The depth of recess 25 is approximately .0035–.004 inch. The dimensions of the recess 25 are variable but in general should be slightly larger than the outer dimensions of the integrated circuit chip to be bonded to the leads 18.

The next step is to inlay recess 25 with a material compatible with the semi-conductor material for bonding purposes. In the present invention this material comprises a layer of aluminum contacting metal 26 on which is clad a layer 28 of copper. The purpose of the cladding layer 28 is to provide a bond between the aluminum layer 26 and the strip 20 since Kovar, nickel or mild steel cannot readily bond to aluminum. Copper, on the other hand, adequately bonds to these metals. The copper layer is approximately, .0005–.001 inch. The contacting metal 26 with its cladding 28 is inlaid in recess 25 by any one of several well known processes such as soldering, rolling, ultrasonic bonding, or the like. In the preferred embodiment, the inlaying is accomplished by soldering. Those skilled in the state of the art will readily recognize that the recess 25 could be omitted by applying the contacting metal 26 to the surface of strip 20 and rolling it in or by applying the contacting metal 26 to spaced recesses rather than a continuous groove.

For some forms of semi-conductor devices it may not be necessary to inlay the contacting material 26. Rather, it may be sufficient to merely coat the strip 20 with the required thickness of contacting metal in equally spaced areas along the recess 25. The coating of the contacting metal could be done by any conventional evaporation or plasma gun process or their equivalent.

Figure 5:
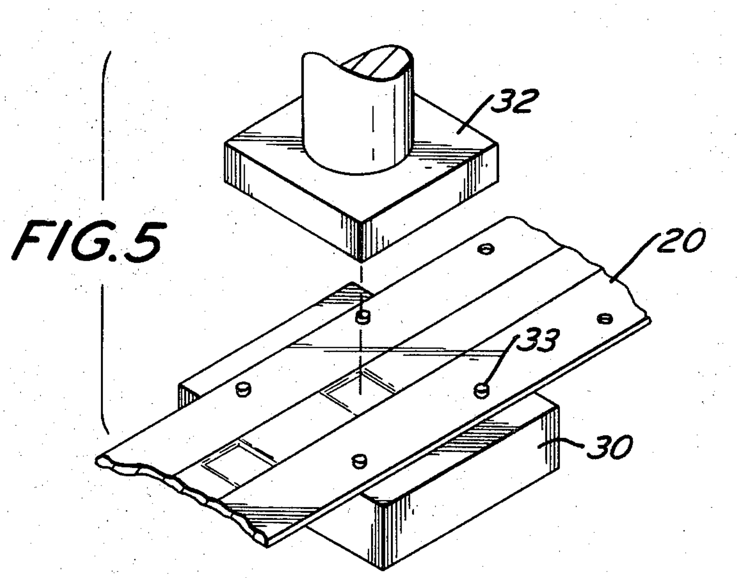
FIG. 5 is a partial perspective view of a forming step.

Once the contacting metal has been inlaid, coated or otherwise overlaid to the area defined by the recess 25 on the strip 20, the next process step may be taken. This next process step as schematically illustrated in FIG. 5 consists of forming the metal, as by bending, to provide a depression on the side including the contacting metal and a outstanding portion on the side opposite thereto. The metal bending step is schematically illustrated in FIG. 5 where the strip 20 is aligned on the table 30 by the pins 33 which protrude through the orientation holes 22. A bending device 32 cooperates with the table 30 to bend or otherwise form the metal so as to form the required shape. This step is not a stamping operation since it does not remove the metal as such. Rather, it is merely a bending or metal forming operation.

Figure 6:
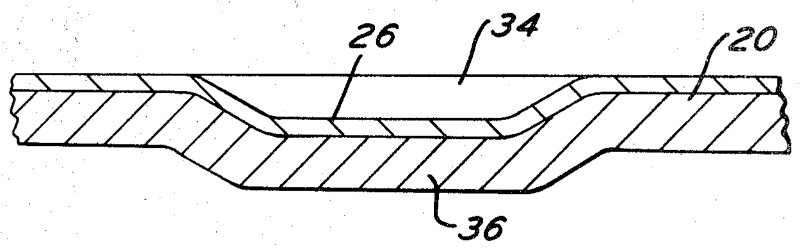
FIG. 6 is a longitudinal sectional view of the strip after the forming step illustrated in FIG. 5.
Figure 7:
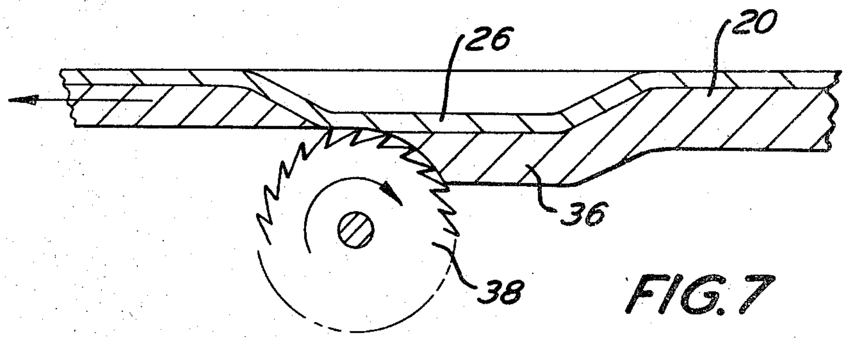
FIG. 7 is a longitudinal sectional view of a subsequent processing step.

The result of the metal forming step is illustrated in FIG. 6 where an enlarged longitudinal sectional view of the strip 20 at the area overlaid by the contacting metal 26 is shown. As shown, the metal has been bent so as to form a depression 34 on the side where the contacting metal 26 has been overlaid. An outstanding portion 36 has been formed on the opposite side. Since there has been no substantial reduction in the thickness of the strip 20 in combination with the contacting metal 26, it follows that the depth of the depression 34 is approximately equal to the height of the outstanding portion 36 as measured from their respective surfaces. Once the metal forming step has been performed so as to bend the strip 20 into the required shape at the overlaid portion, it is ready for further processing.

The next step in the process is the removal of the outstanding portion 36 of strip 20 so as to assure that the metal in the region of the cantilever leads 26 is of sufficient thinness that a punch may be employed to fabricate the small cantilever leads which are preferably approximately .003 inch wide at their ends. The removal of the outstanding portion 36 may be performed by any one of a plurality of metal removal processes such as skiving, grinding, or cutting with a cutter 38 as shown. The cutter 38 may be a carbide-steel cutter over which the strip 20 is drawn to remove the outstanding portion 36. This processing technique offers still another advantage of exposing the contacting metal on the side opposite the depression 34 in order to assure a homogeneous lead tip further providing the ability to bond the semi-conductor to either side of the lead frame.

When this latter step has been completed, the strip 20 will have a plurality of depressions 34 on one side thereof but be flat generally on the opposite side. The strip 20 will be of a reduced thickness in the area of the contacting metal and said contacting metal 26 will be exposed on both sides of the strip. The preferred thickness of the reduced area is .002–.004 inch which means that all of the outstanding portion 36 which includes the metal of strip 20 has been removed but very little of the contacting metal 26 is removed by the cutter 38 or its equivalent.

Figure 8:
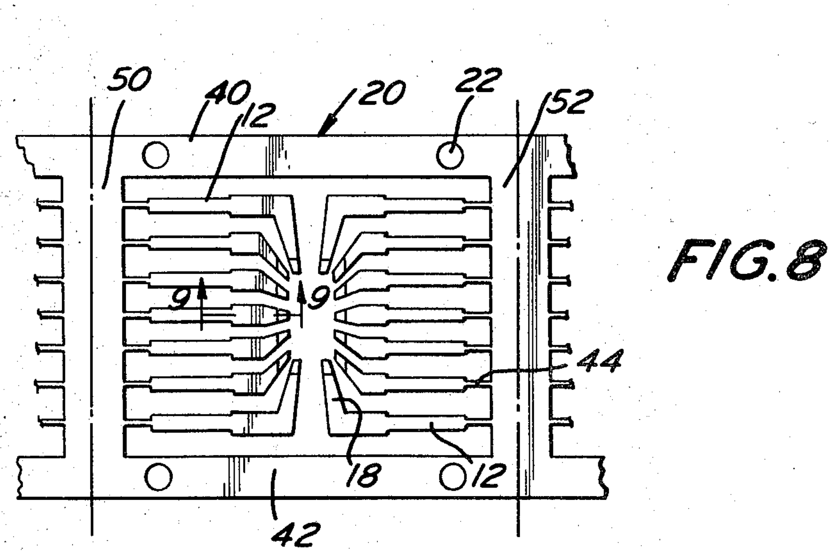
FIG. 8 is a partial plan view of the strip of metal after a stamping step.

The next step in the processing of strip 20 is to pass it between the platen and head of a stamping machine (not shown). FIG. 8 illustrates the result of this stamping operation. The strip 20 has now been formed into a plurality of lead frames defined by the side elements 40 and 42 on the one hand and the webs 50 and 52 on the other hand. The stamping operation has now formed each of the leads 12 as well as their terminal ends 18. The leads 12 are each joined to either the web 50 or the web 52 by a tie piece 44 which is later removed from the final product.

Figure 9:
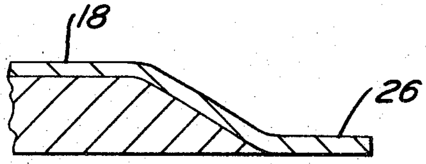
FIG. 9 is a partial sectional view of the strip illustrated in FIG. 8.

An enlarged view of a terminal end 18 of one of the leads 12 is shown in FIG. 9. Thus, the terminal end 18 is illustrated as having an end portion 26 of reduced thickness. The end portion is formed of a contacting metal and thus is ready to engage a semi-conductor device and be bonded to it.

Figure 10:
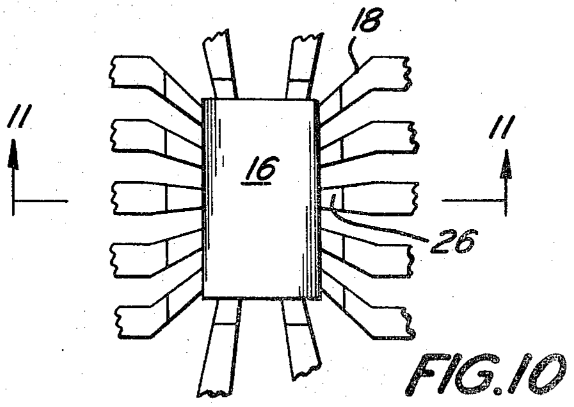
FIG. 10 is an enlarged partial top plan view showing an integrated circuit chip welded to the terminal ends of the leads illustrated in FIGS. 8 and 9.
Figure 11:
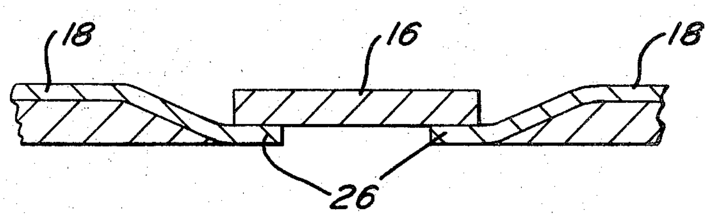
FIG. 11 is a sectional view taken along the line 11—11 in FIG. 10.

The integrated circuit chip or wafer 16 may be bonded to the terminal ends 18 of the leads 12. This may be done before or after separating the lead frames by cutting the webs 50 and 52 along the median lines. In either case, the process involves positioning the semi-conductor 16 as shown in FIGS. 10 and 11 so as to be in contact with the contacting metal 26 at the terminal end 18 of each of the leads. Thereafter, the semi-conductor 16 is bonded to the contacting metal by any conventional means such as ultrasonic welding thermocompression bonding, or soldering. Finally, the process is completed by encapsulating the chip 16, the contacting metal 26 and the terminal ends 18 of leads 12. The manufacturing operation is completed by removing the side elements 40 and 42 as well as the webs 50 and 52 and the tie pieces 44 so as to arrive at a product substantially like that shown in FIG. 1.

The foregoing process of manufacturing has resulted in a lead frame complete with inwardly extending cantilever leads integrally provided with lead tips of such a size and metallurgical characteristic that the bonding of a semi-conductor chip directly to the lead frame is made possible without the employment of present state of the art interconnects such as gold wires or other methods apparent to those skilled in the state of the art. This has been accomplished by one stamping operation capable of high production rates.

The present invention may be embodied in other specific forms without departing from the spirit or essential attributes thereof and, accordingly, reference should be made to the appended claims, rather than to the foregoing specification as indicating the scope of the invention.

It is claimed:

1. In a method of attaching leads to a semi-conductor device comprising the steps of overlaying a portion of a metal strip with a contacting metal suitable for bonding to a semi-conductor material, forming said overlaid portions of said strip and contacting metal to provide a depression on one side and an outstanding portion on the other side of the strip, removing the outstanding portion so that at least a portion of the strip that includes the contacting metal is of reduced thickness, and then stamping said strip at spaced points to define integral cantilever leads having said contacting metal on their distal ends.

2. In a method in accordance with claim 1 wherein said overlaying step includes forming a recess in one surface of said metal and inlaying said contact metal in said recess.

3. In a method of attaching leads to a semi-conductor device comprising the steps of overlaying an elongated metal strip with a contacting metal compatible with the semi-conductor device, forming overlaid portions of said strip and contacting metal at spaced points to provide a depression on the overlaid side and an outstanding portion on the opposite side of said strip, removing the outstanding portions so that at least a portion of the strip that includes the contacting metal is of reduced thickness, and then stamping said strip at spaced points to define integral cantilever leads having said contacting metal on their distal ends.

4. In a method of attaching leads to a semi-conductor device comprising the steps of overlaying a portion of a metal strip with a contacting metal suitable for compatible bonding to a semi-conductor material, forming overlaid portions of said strip and contacting metal at spaced points to provide a depression on the overlaid side of said strip and an outstanding portion on the opposite side of said strip, removing the outstanding portion so that said overlaid portion is of a lesser thickness than the remainder of said strip, and then stamping said strip at said spaced points to define integral cantilever leads having said contacting metal on their distal ends.

5. In a method in accordance with claim 4 wherein said step of removing the outstanding portion includes skiving off the outstanding portion.

6. In a method in accordance with claim 4 wherein said step of removing the outstanding portions includes grinding off the outstanding portions.

7. In a method in accordance with claim 4 wherein said step of overlaying a portion of a metal strip with a contacting metal includes forming a recess at said portion and then inlaying said contacting metal in said recess.

References Cited

UNITED STATES PATENTS

| | | | |
|---|---|---|---|
| 3,281,628 | 10/1966 | Bauer et al. | 29—588 |
| 3,494,022 | 2/1970 | Maute | 29—630 |

JOHN F. CAMPBELL, Primary Examiner

D. M. HEIST, Assistant Examiner

U.S. Cl. X.R.

29—577